(12) United States Patent
Chen et al.

(10) Patent No.: US 8,129,609 B2
(45) Date of Patent: Mar. 6, 2012

(54) INTEGRATED THERMOELECTRIC COOLING DEVICES AND METHODS FOR FABRICATING SAME

(75) Inventors: Howard Hao Chen, Yorktown Heights, NY (US); Richard C. Chu, Hopewell Junction, NY (US); Louis L. Hsu, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 12/465,419

(22) Filed: May 13, 2009

(65) Prior Publication Data

US 2009/0217961 A1    Sep. 3, 2009

Related U.S. Application Data

(63) Continuation of application No. 10/988,015, filed on Nov. 12, 2004, now Pat. No. 7,544,883.

(51) Int. Cl.
*H01L 35/28* (2006.01)

(52) U.S. Cl. ....................................................... 136/224

(58) Field of Classification Search .................... 136/224
See application file for complete search history.

(56) References Cited

U.S. PATENT DOCUMENTS

| | | | | |
|---|---|---|---|---|
| 5,228,923 A | * | 7/1993 | Hed | 136/208 |
| 5,232,516 A | * | 8/1993 | Hed | 136/204 |
| 5,837,929 A | * | 11/1998 | Adelman | 136/225 |
| 5,956,569 A | * | 9/1999 | Shiu et al. | 438/48 |
| 6,000,225 A | * | 12/1999 | Ghoshal | 62/3.7 |
| 6,094,919 A | * | 8/2000 | Bhatia | 62/3.7 |
| 2002/0033189 A1 | * | 3/2002 | Macris | 136/203 |
| 2003/0129783 A1 | * | 7/2003 | Pomerene et al. | 438/54 |

* cited by examiner

*Primary Examiner* — Alexa Neckel
*Assistant Examiner* — Miriam Berdichevsky
(74) *Attorney, Agent, or Firm* — F. Chau & Associates, LLC; Brian P. Verminski (57) ABSTRACT

Semiconductor integrated thermoelectric devices are provided, which are formed having high-density arrays of thermoelectric (TE) elements using semiconductor thin-film and VLSI (very large scale integration) fabrication processes. Thermoelectric devices can be either separately formed and bonded to semiconductor chips, or integrally formed within the non-active surface of semiconductor chips, for example.

20 Claims, 8 Drawing Sheets

INTEGRATED THERMOELECTRIC COOLING DEVICES AND METHODS FOR FABRICATING SAME

CROSS-REFERENCE TO RELATED APPLICATION

This is a Continuation Application of U.S. application Ser. No. 10/988,015 filed on Nov. 12, 2004, the disclosure of which is herein incorporated by reference in its entirety.

TECHNICAL FIELD OF THE INVENTION

The present invention relates generally to devices and methods for cooling electronic devices such as semiconductor integrated circuit (IC) chips. More particularly, the invention relates to devices and methods for constructing semiconductor integrated thermoelectric cooling modules having high-density arrays of thermoelectric (TE) elements using semiconductor thin-film and VLSI (very large scale integration) fabrication processes.

BACKGROUND

Figure 1:
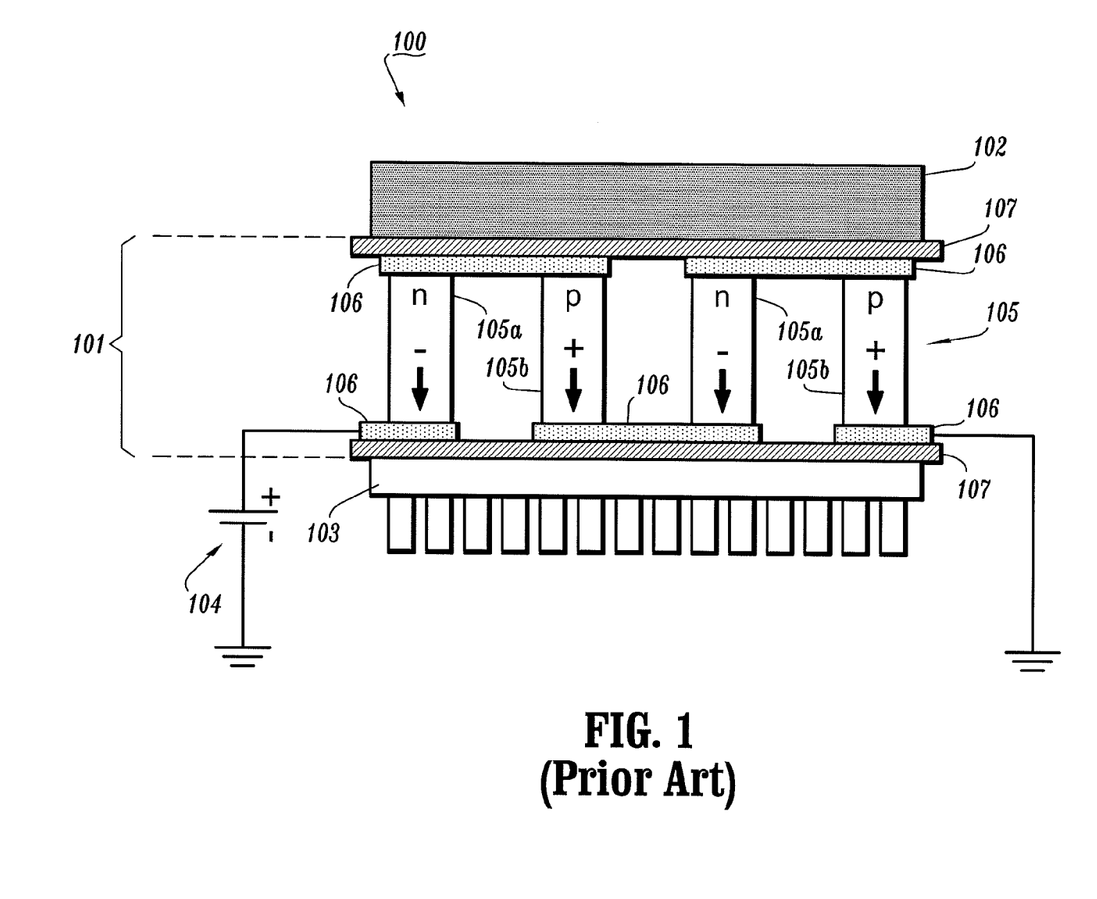
FIG. 1 schematically illustrates a conventional apparatus comprising a low-density thermoelectric module for cooling an electronic device.

In general, thermoelectric cooling devices are solid state heat pumps that are used in a variety of applications where thermal management is required. For instance, thermoelectric cooling modules are implemented for actively cooling electronic components such as semiconductor IC (integrated circuit) chips. By way of example, FIG. 1 schematically illustrates a conventional apparatus (100) for cooling an electronic device. In general, the apparatus (100) comprises a thermoelectric (TE) module (101) that is thermally coupled between an electronic device (102) (e.g., IC chip) and a heat sink (103). The TE module (101) can be electronically operated to transfer heat from the electronic device (102) (heat source) to the heat sink (103) (cooling effect) by applying a DC voltage (104) to the TE module (101) with proper polarity.

In particular, the TE module (101) comprises a plurality of bulk thermoelectric (TE) elements (105), which are connected electrically in series and thermally in parallel. The TE elements (105) comprise alternating n-type TE elements (105a) and p-type TE elements (105b) that are electrically connected via respective interconnects (106). The TE elements (105) and electrical interconnects (106) are mounted between two thermally conductive ceramic substrates (107) which hold the TE module (101) together mechanically and which electrically insulate the TE elements (105).

Typically, the TE elements (105) are formed of bulk n/p-doped semiconductor bismuth telluride ($Bi_2Te_3$) elements. The n-type TE elements (105a) are doped with an excess of electrons and the p-type TE elements (105b) are doped with an excess of holes. The TE module (101) can have an equal number of n-type and p-type elements and each n-type/p-type TE element pair (105a, 105b) forms a TE couple element. Conventional TE modules such as depicted in FIG. 1 typically can have one to several hundred TE couples.

The cooling capacity of the TE module (101) is proportional to the magnitude and polarity of the DC current applied via DC source (104) and the thermal conditions on each side of the module (101). By applying a DC voltage to the TE module (101) having the polarity as depicted in FIG. 1, heat can be transferred by the TE module (101) from the device (102) to the heat sink (103). The electrons and holes are the carriers that move the heat energy through the TE module (101). By applying a direct current through the TE elements (105) as shown, both the electrons and holes are moved from one side of the TE module (101) to the other side of the TE module (101) through the TE elements (105), while electric current flows back and forth between the two junctions of TE module (101) and alternately through each n-type TE element (105a) and p-type TE element (105b).

In particular, the transfer of heat energy is due to the Peltier effect, where heat is absorbed at one junction (e.g., the junction between the module (101) and the device (102)) to compensate for the loss of charged carriers and generate additional pairs of electrons and holes, while heat is released at the other junction (e.g., the junction between the TE module (101) and the heat sink (103)) as the electrons combine with holes. More specifically, as depicted in FIG. 1, both holes (+) and electrons (−) move through the TE elements (105) away from the junction between the TE module (101) and the device (102), toward the junction between the TE module (101) and the heat sink (103), as a consequence of the DC current flow through the junction. Holes move through the p-type elements (105b) and electrons move through the n-type elements (105a) toward the heat sink (103). To compensate for the loss of charge carriers, additional electrons are raised from the valence band to the conduction band to create new pairs of electrons and holes. Since energy is required to do this, heat is absorbed at the junction between module (101) and the device (102). Conversely, as an electron drops into a hole at the other junction, surplus energy is released in the form of heat.

The direction of the heat flow depends on the polarity of the DC voltage (104) applied to the TE module (101) such that heat can be pumped through the TE module in either direction. Consequently, the TE module (101) may be used for both heating and cooling, which makes it suitable for applications that require precise temperature control. Furthermore, the TE module can be used for power generation, as a result of the Seebeck effect, where a current is generated due to the temperature differential across the TE module.

SUMMARY OF THE INVENTION

In the design and manufacture of semiconductor IC (integrated circuit) chip packages and modules (e.g., SCM (single chip modules) or MCMs (multi-chip modules)), it is imperative to implement mechanisms that can effectively remove heat generated by high-performance IC chips, such as microprocessors, to ensure continued reliable operation of the IC chips. Effective heat removal becomes increasingly problematic as chip geometries are scaled down and circuit devices and chips are more densely packed, and operating speeds are increased, which result in increased power density. Indeed, increased system performance is limited primarily by the ability to implement effective heat removal mechanisms to cool the IC chip modules.

Although conventional thermoelectric devices such as described with reference to FIG. 1 may be implemented for cooling IC chips, such devices comprise very low-density TE element arrays and, consequently, do not provide the required cooling capacity for cooling high-performance chips or package structures with high-power densities. Indeed, conventional TE modules with only several hundred TE couples can provide heat removing capacity on the order of about 10 W/cm².

In general, exemplary embodiments of the invention include semiconductor integrated thermoelectric cooling devices comprising high-density arrays of thermoelectric elements, which are fabricated using semiconductor thin-film and VLSI (very large scale integration) processes. Exemplary methods for constructing thermoelectric devices according to the invention enable a significant reduction of the dimensions of TE elements using advanced thin-film material and technologies to provide a significant improvement in heat pumping capacity of the integrated TE devices as compared to conventional modules. For instance, ultra high-density TE devices according to embodiments of the invention may be formed to include 20 million cells per centimeter square and 50 I/Os, yielding a heat removing capacity of 1200 W/cm$^2$.

More specifically, in one exemplary embodiment of the invention, method for fabricating a thermoelectric device includes forming a pattern of step structures on a substrate, the step structures being formed of an insulating material, forming a conformal layer of TE (thermoelectric) material over the substrate surface and the step structures, forming TE elements from TE material on sidewalls of the step structures, and forming interconnects between TE elements.

In one exemplary embodiment of the invention, the pattern of step structures are formed using a self-aligned (mask-less) Damascene process. For example, a process of forming the pattern of step structures includes forming a layer of first insulating material on the substrate, forming a pattern of recesses in the layer of first insulating material, filling the recesses with a second insulating material, removing the first insulating material to form the pattern of step structures on the substrate, wherein the step structures are formed of the second insulating material.

In another exemplary embodiment of the invention, an integrated thermoelectric cooling device comprises an array of TE (thermoelectric) elements including n-type/p-type element pairs (or "TEC (thermoelectric couple) elements"), wherein the TE elements are formed using mask-less doping techniques. More specifically, in one exemplary embodiment of the invention, the step structures are processed to form taped sidewalls on the sides of the step structures and the layer of TE material is conformally deposited over the substrate and step structures with tapered sidewalls. A first angle implantation process is performed to dope the TE material on first sidewalls of each step structure with n-type material, and a second angle implantation process is performed to dope the TE material on second sidewalls of each step structure with p-type material. As a result, each step structure comprises a TE couple formed thereon.

In other exemplary embodiments of the invention, the interconnects formed between adjacent TE elements are formed of metal silicide using a self-aligned silicidation process. For instance, in one exemplary embodiment wherein the TE elements are formed using silicon germanium (SiGe), a self-aligned silicidation process includes forming spacers on the TE elements, depositing a layer of metal (such as titanium Ti) over the spacers and exposed regions of the layer of TE material, performing an annealing process to convert the regions of the layer of TE material in contact with the layer of metal to metal silicide, and removing un-reacted regions of the layer of metal.

In other exemplary embodiments of the invention, the substrate on which the integrated TE device is formed is a SOI (silicon on insulator) substrate comprising a thin layer of silicon (front surface of the SOI substrate) formed on a buried oxide layer. In such embodiments, the TE element array is formed using the thin silicon layer on the front surface of the SOI substrate and the bottom surfaces of the step structures directly contact the buried oxide layer of the SOI substrate. Further, a layer of third insulating material over the TE elements and interconnects to encapsulate the thermoelectric device, such that the TE elements and interconnects are completely insulated by the buried oxide layer of the SOI substrate and the encapsulating insulating layer.

Exemplary embodiments of the invention further include devices and methods for building chip package structures that implement high-density, high-efficiency and small-sized TE cooling devices. For example, one exemplary embodiment of the invention includes a semiconductor chip having an integrated TE cooling device integrally formed on a non-active (back) surface of the semiconductor chip.

In particular, in one exemplary embodiment of the invention, the semiconductor chip may comprise a separate silicon IC chip with the TE cooling device integrally formed on a back silicon surface thereof. In another exemplary embodiment, the semiconductor chip is formed from a SOI substrate, wherein the IC device layer is formed in a bulk silicon (back) layer of the SOI substrate and the TE cooling device is formed using a thin silicon layer on the front surface of the SOI substrate. In addition, the exemplary chip package structures include a heat sink or cooling module thermally bonded to the integrate TE cooling device to dissipate heat transferred from the integrated TE cooling device.

In another exemplary embodiment, a stand-alone TE cooling device is separately fabricated and then thermally bonded to the non-active (back) surface of an IC chip. Further, in one exemplary embodiment of the invention wherein the TE cooling device is formed using a SOI substrate, an integrated heat sink or micro-channel cooling module can be formed using the bulk silicon layer on the back of the SOI substrate.

In other exemplary embodiments of the invention, TE elements are embedded within integrated circuits of an IC chip in proximity to devices, elements, components, etc., of an integrated circuit, to enable precise and localized temperature control for desired regions/portions of the IC chip (e.g., increased heat removal for "hot spot" regions of the chip). For example, embedded TE elements can be strategically formed in an IC chip to enable rapid and precise temperature control through local heating or cooling operations.

These and other exemplary embodiments, aspects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 2A:
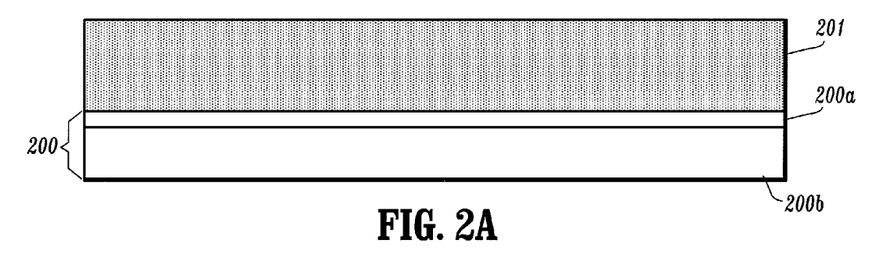
FIGS. 2A~2K illustrate a method for fabricating a high-density semiconductor integrated thermoelectric cooling device according to an exemplary embodiment of the invention.

FIGS. 2A~2K illustrate a method for fabricating a high-density semiconductor integrated thermoelectric cooling device according to an exemplary embodiment of the present invention. More specifically, FIGS. 2A~2K illustrate a method for fabricating a high-density thermoelectric cooling module using semiconductor thin-film and VLSI (very large scale integration) processes. Referring to FIG. 2A, an initial step includes forming a first insulating film layer (201) (e.g., dielectric film) on a semiconductor substrate (200). The semiconductor substrate (200) comprises a layer of silicon (200a) formed on a buried oxide layer (200b). Depending on the application, the substrate (200) may comprise a SOI (silicon-on-insulator) substrate. In an exemplary embodiment wherein the substrate (200) is an SOI substrate, the back (bottom) of the substrate (200) would comprise a thick bulk silicon layer (not shown) with the buried oxide layer (200b) interposed between the bulk silicon layer and the thin silicon layer (200a). In other exemplary embodiments, the oxide layer (200b) and silicon layer (200a) may be formed on a semiconductor substrate (e.g., non-active surface of a chip).

In one exemplary embodiment of the invention, the first insulating film layer (201) is formed by depositing a TEOS (tetra-ethyl-ortho-silicate)-based silicon dioxide ($SiO_2$) using a chemical vapor deposition (CVD) process. As explained below, the thickness of the first insulating film layer (201) will determine the height of step structures on which thermoelectric elements are formed. In one exemplary embodiment of the invention, the thickness of the first insulating film layer (201) is in a range of about 0.1 micron to about 1 micron.

Figure 2B:
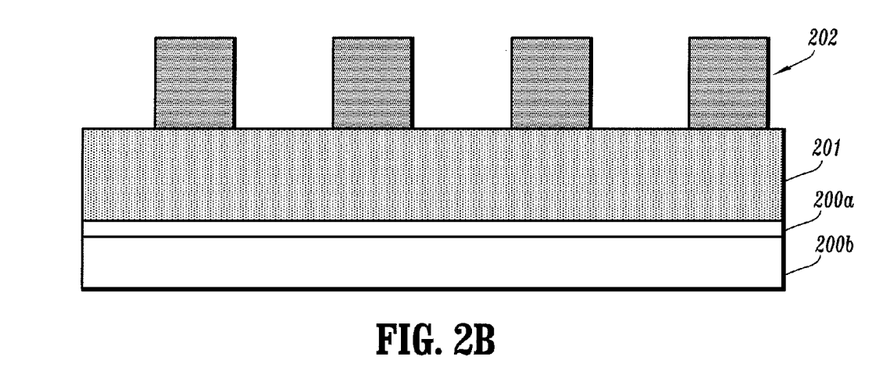

Referring to FIG. 2B, a mask layer (202) is formed on the first insulating film layer (201), which is used as mask for etching the first insulating film (201) and the silicon layer (200a). In one exemplary embodiment, the mask layer (202) is formed by depositing and patterning a layer of photoresist material using lithographic patterning techniques known by those of ordinary skill in the art. An anisotropic etching process is performed to etch the portions of the first insulating film layer (201) and silicon layer (200a) exposed by the mask layer (202), wherein the etching is performed down to the surface of the oxide layer (200b).

Figure 2C:
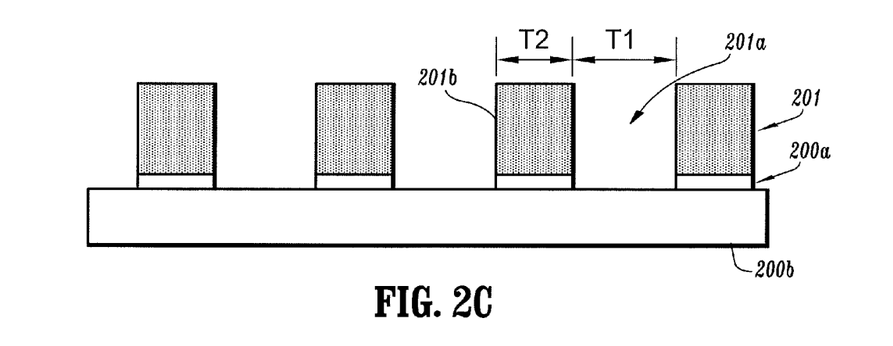

In particular, FIG. 2C is a cross-sectional view of the structure of FIG. 2B after etching the exposed portions of the first insulating film layer (201) and the silicon layer (200a) down to the oxide layer (200b), and removing the mask (202). In one exemplary embodiment of the invention, a dry etch process is performed using $CF_4$ plasma to anisotropically etch the insulating layer (201) and silicon layer (200a), and the mask layer (202) is removed by using an oxygen-based plasma (e.g., ashing). As depicted in FIG. 2C, the resulting structure is formed having etched trenches (201a) of width T1 and step structures (201b) of width T2. It is to be noted that in one exemplary embodiment of the invention, the trenches (201a) and insulating structures (201b) extend in a longitudinal direction across the substrate (200) orthogonal to the plane of the drawing sheet. Moreover, as will be evident below, the dimensions T1 and T2 will be selected depending on the desired density of TE elements for the thermoelectric device. In one exemplary embodiment of the invention, the values of T1 and T2 are in a range of about 5 microns to about 10 microns. As such, the pitch (T1+T2) of the step structures is in a range of about 10 microns to about 20 microns.

Figure 2D:
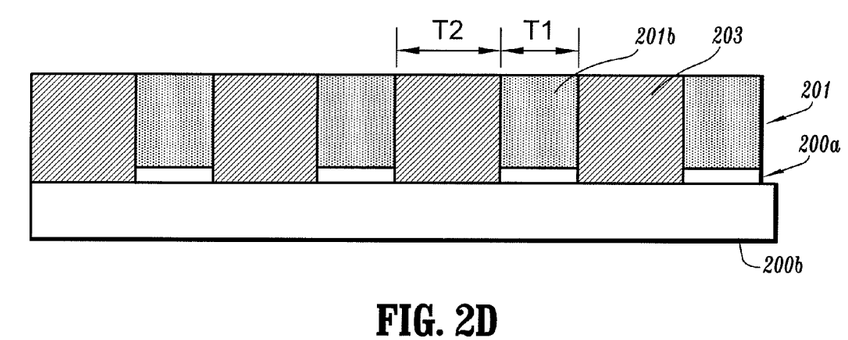

Next, a second insulating material (e.g., dielectric material) is deposited on the structure of FIG. 2C to fill the trenches (201a). For example, FIG. 2D is a cross-sectional view of the structure of FIG. 2C illustrating second insulating material (203) filling the trenches between the step structures (201b). In one exemplary embodiment, the trenches are filled by depositing a second insulating layer of second insulating material and then etching the second insulating layer down to the surface of the first insulating layer (201). More specifically, in one exemplary embodiment of the invention, the second insulating material (203) comprises a nitride material or diamond material, which is deposited via CVD and planarized using CMP (chemical mechanical polishing), for example.

Figure 2E:
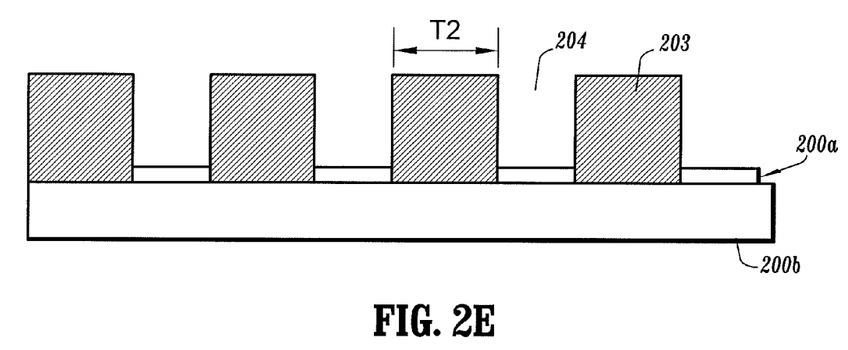

Next, the remaining portions (201b) of the first insulating film layer (201) are selectively removed down to, and exposing, the underlying portions of the silicon layer (200a). In particular, FIG. 2E is a cross-sectional view of the structure of FIG. 2D after selective removal of the first insulating material (201b) to form a pattern of step structures (203) of width T2, and with spaces (204) of width T1 between the step structures (203) (i.e., the pitch of the step structures (203) is T1+T2). As will be explained below, the step structures (203) formed of the second insulating material are structures upon which TE elements are subsequently formed.

It is to be appreciated that the pattern of insulating step structures (203) are formed using a self-aligned Damascence process, wherein the pattern of step structures (203) is first lithographically defined in the first insulating film layer (201), wherein the second insulating material is deposited to fill resulting trenches and then excess second insulating material layer is planarized down to the surface of the first insulating material (201) by means of chemical-mechanical polishing.

Figure 2F:
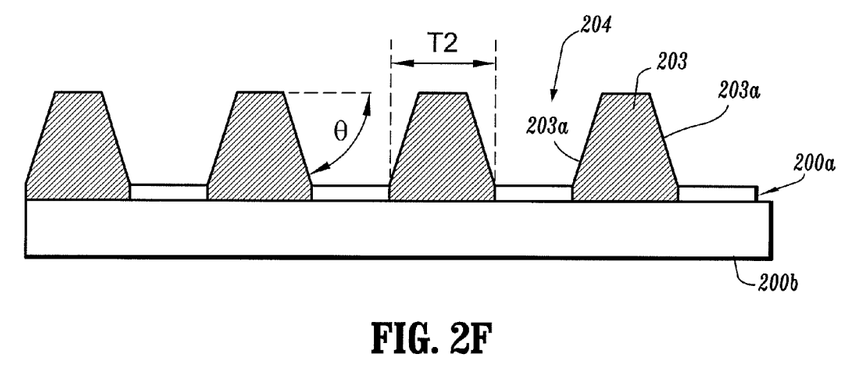

Next, in one exemplary embodiment of the invention, the resulting structure depicted in FIG. 2E is subjected to an etch process to taper sidewalls of the insulating step structures (203). For example, FIG. 2F illustrates the step structures (203) having tapered sidewalls (203a) on opposing sides thereof. The tapered sidewalls (203a) can be formed using a controlled wet etching process, for example. In one exemplary embodiment, the tapered sidewalls (203a) can be formed having an angle θ in a range of between about 75° to about 90°. As explained below, the tapered sidewalls (203a) facilitate an angle implantation process for forming n-type and p-type TE elements on opposing tapered sidewalls (203a) of each of the step structures (203). The degree of the angle will vary depending on the desired pitch of the insulating step structures (203). For example, as the insulating step structures (203) are further spaced apart (greater pitch), the amount of tapering of the sidewalls that is needed for sufficient dopant implantation becomes less.

Figure 2G:
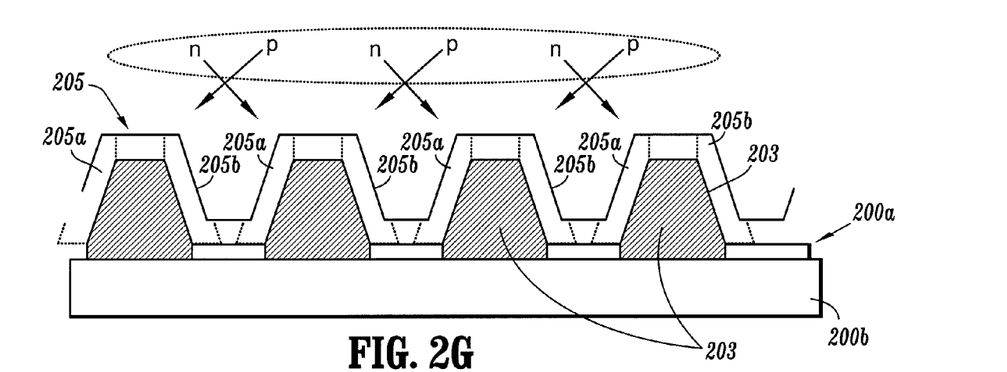

Next, a series of processing steps are performed to form TE elements and interconnects starting with the exemplary structure depicted in FIG. 2F. Initially, a thin-film layer of thermoelectric material is deposited on the structure of FIG. 2F. In particular, in one exemplary embodiment as depicted in FIG. 2G, a conformal layer of thermoelectric material (205) is formed over the step structures (203) and the portions of the silicon layer (200a) between the step structures (203). In one exemplary embodiment, the thermoelectric material layer (205) is formed to have a thickness in a range from about 50 nm to about 500 nm.

In one exemplary embodiment, the thermoelectric material layer (205) is preferably formed with an extrinsic alloy semiconductor material such as silicon germanium (SiGe) or other compounds such as zinc antimonite, indium antimonite, lead telluride, bismuth telluride, and Li—Ni—O compounds, for example. Extrinsic alloy semiconductor materials provide electrical properties that are desirable for forming TE elements. For example, such materials provide suitable electrical conductivity while maintaining high thermal resistivity (C/W). Moreover extrinsic alloy semiconductor materials exhibit relatively large Seebeck coefficients and narrow band gap, which limits the back flow of Fourier heat conduction from the hot junction to the cold junction.

In one preferred exemplary embodiment of the invention, the thermoelectric material layer (205) is formed of silicon germanium (SiGe). A thermoelectric material layer (205) of SiGe can be grown epitaxially using the exposed surface portions of the silicon layer (200a) as a seed for epitaxial growth. In such embodiment, the silicon layer (200a) is preferably a single crystal structure (as opposed to amorphous or polysilicon), which can be used to re-crystallize an amorphous SiGe layer (205) into a single crystal SiGe layer (205) to provide increased electron mobility and other desirable electrical characteristics as is understood by those of ordinary skill in the art. A thermoelectric layer (205) of SiGe can be deposited using a CVD process in a low temperature environment (<300° C.).

The next step in the exemplary process includes doping portions of the thermoelectric material layer (205) using an ion implant process to form p-type and n-type TE elements on opposing sidewalls of the step structures (203). In particular, as depicted in the exemplary embodiment of FIG. 2G, an angle implantation process (which does not require a mask) is performed using known techniques to implant dopants in portions (205a) and (205b) of the thermoelectric material layer (205) on the tapered sidewalls (203a) of the step structures (203). For instance, the portions (205a) of the thermoelectric material layer (205) are first doped with an n-type dopant, and then portions (205b) of the thermoelectric material layer (205) are doped with a p-type dopant.

Figure 2H:
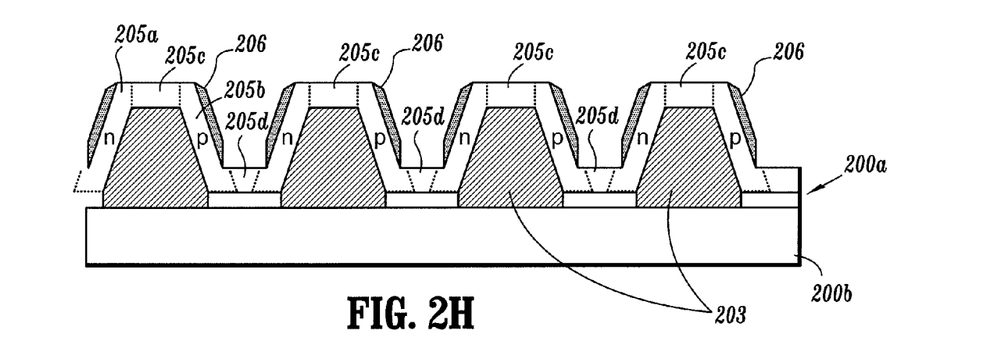

After implantation, an annealing process is performed under desirable conditions to activate the implanted dopants and convert the doped portions (205a) and (205b) into n-type TE elements (205a) and p-type TE elements (205b), respectively, as depicted in FIG. 2H. For instance, the implanted dopants can be activated via a rapid thermal or laser annealing process. In the exemplary embodiment of FIG. 2G, for example, each n/p-type element pair formed on a given step structure (203) comprises a TE couple element (or TEC element).

As further depicted in FIG. 2H, nitride spacers (206) are formed over the n-type and p-type TE elements (205a, 205b). In one exemplary embodiment of the invention, the nitride spacers (206) can be formed by depositing a conformal layer of nitride and anisotropically etching the conformal nitride layer at etch rates which enable the nitride layer in the horizontal portions (205c) and (205d) of the thermoelectric material layer (205) to be completely etched away, while leaving nitride material on the TE elements (205a) and (205b) to form nitride spacers (206). A conformal nitride layer can be formed using a LPCVD process, for example, or other methods known to those of ordinary skill in the art. The conformal nitride layer can be anisotropically etched using RIE (Reactive Ion Etching), for example.

Figure 2I:
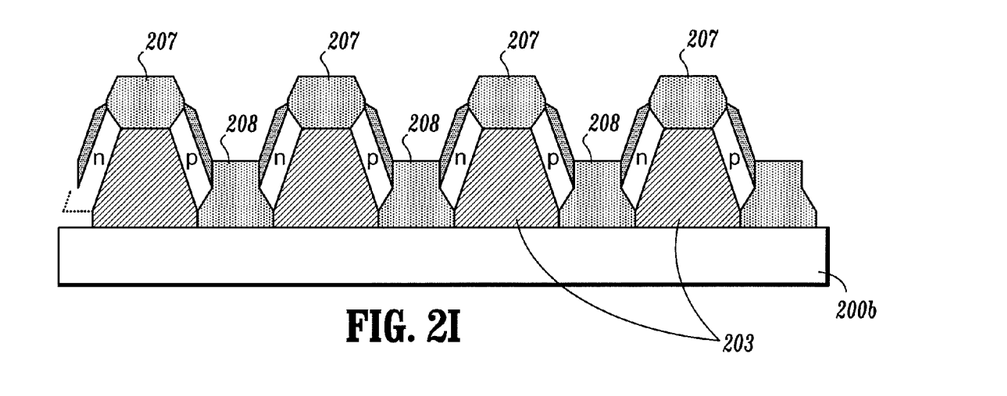

Next, electrical interconnects are formed between adjacent TE elements (205a) and (205b). For instance, FIG. 2I is a cross-sectional view of the structure of FIG. 2H after formation of top and bottom interconnects (207) and (208). In one exemplary embodiment of the invention wherein the thermoelectric material layer (205) is formed of SiGe, the interconnects (207) and (208) can be formed using a self-aligned silicidation process, wherein the exposed regions (205c) and (205d) of the thermoelectric material layer (205) (see FIG. 2H) are converted to a metal silicide (or "salicide") to form metal silicide interconnects (207) and (208). Salicide is a term used to refer to a silicide that is formed using a self-aligned silicidation process.

More specifically, by way of example, a self-aligned silicidation process comprises blanket depositing a thin layer of metal such as titanium (Ti) (or other suitable metals such as Ta, for example) over the structure depicted in FIG. 2H and performing a RTA (rapid thermal annealing) process to form a metal silicide, $TiSi_2$, interconnects (207) and (208) in regions (205c and 205d) where the spacers (206) are absent and the metal layer contacts the SiGe layer. The un-reacted portion of the Ti metal layer (e.g., the metal formed on the spacers (206)) is then removed using a wet chemical stripping process, for example.

Figure 2J:
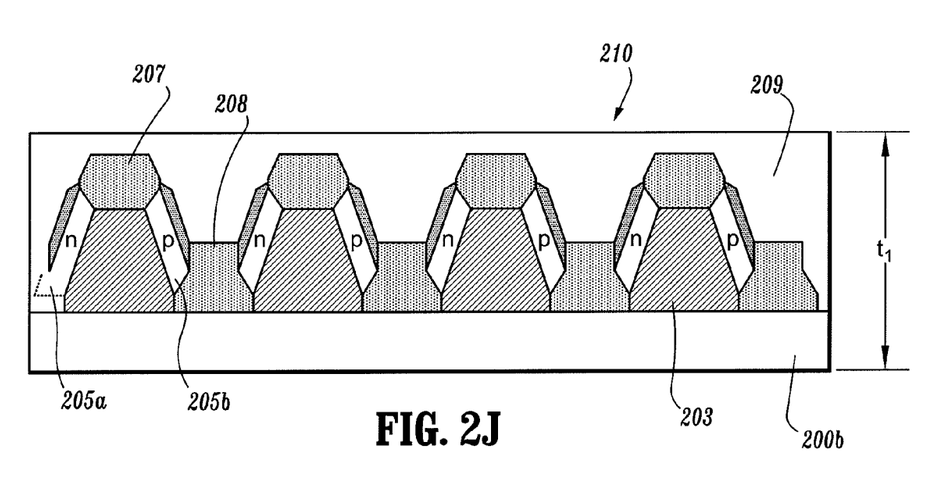

After formation of interconnects (207) and (208), a thick layer of insulating material is formed over the resulting structure to encapsulate the TE elements (205a) and (205b), spacers (206) and interconnects (207) and (208). For instance, FIG. 2J is a cross-sectional view of the structure of FIG. 2I after formation of a third insulating layer (209). In an exemplary embodiment of the invention, the insulation layer (209) is formed by depositing a TEOS-based silicon dioxide ($SiO_2$) using a CVD process. In the exemplary embodiment of FIG. 2J, the TE elements and interconnects are fully insulated, and encapsulated by, the oxide layer (200b) and the insulation layer (209). In one exemplary embodiment, the overall thickness (t1) of the resulting structure is in a range of about 0.5 microns to about 5 microns. The structure depicted in FIG. 2J comprises a high-density integrated TE device (210) according to an exemplary embodiment of the invention.

Figure 2K:
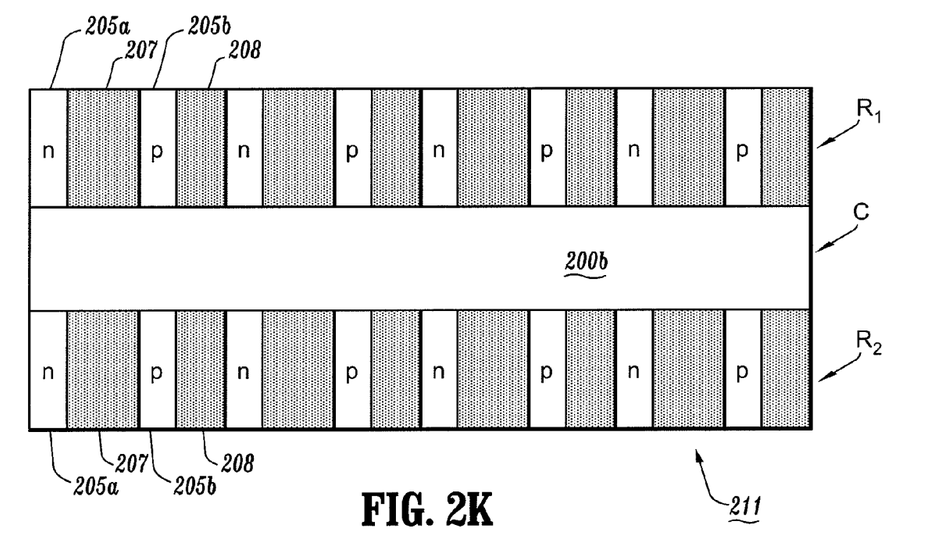

The integrated TE device (210) can be further processed to form a particular array or pattern of TE elements, which is desirable for a given application. For instance, FIG. 2K is a top plan view of the thermoelectric device (210) of FIG. 2J according to an exemplary embodiment of the invention after etching a channel (C) through the insulating layer (209) down to the buried oxide layer (200b) to form a plurality of rows (R1) and (R2) of TE elements. In particular, in one exemplary embodiment, a photolithographic patterning process is performed to form a photoresist mask that is used as an etch mask to etch away those portions of the insulating layer (209), interconnects (207) and (208), TE elements (205a, 205b) and sidewall spacers (206) in a defined region (C) between adjacent rows R1 and R2 of TE elements. The etching is performed down to the surface of the buried oxide layer (200b). The resulting exemplary structure of FIG. 2K is an integrated TE device (211) according to another exemplary embodiment of the invention comprising a high-density array of TE elements.

It is to be appreciated that semiconductor integrated TE devices according to the invention can be implemented in package structures (e.g., SCMs, MCMs) for cooling semiconductor IC chips. For example, as explained below, TE devices can be can be separately formed, stand-alone devices that are thermally coupled/bonded to a semiconductor chip. Moreover, TE devices can be integrally formed within a semiconductor chip. In such embodiments, the TE element array of the TE device can be designed can be formed with varying patterns in consideration of the temperature control requirements for the given application. For example, the TE element array of an integrated TE device, which is to be used with a semiconductor chip, can be designed/patterned based on a power map of an IC chip. An ultra high-density thermoelectric cooling module, with 20 million cells per centimeter square and 50 I/Os, could yield a heat removing capacity of 1200 $W/cm^2$, as compared to about 10 $W/cm^2$ with conventional low-density TE modules.

Figure 3:
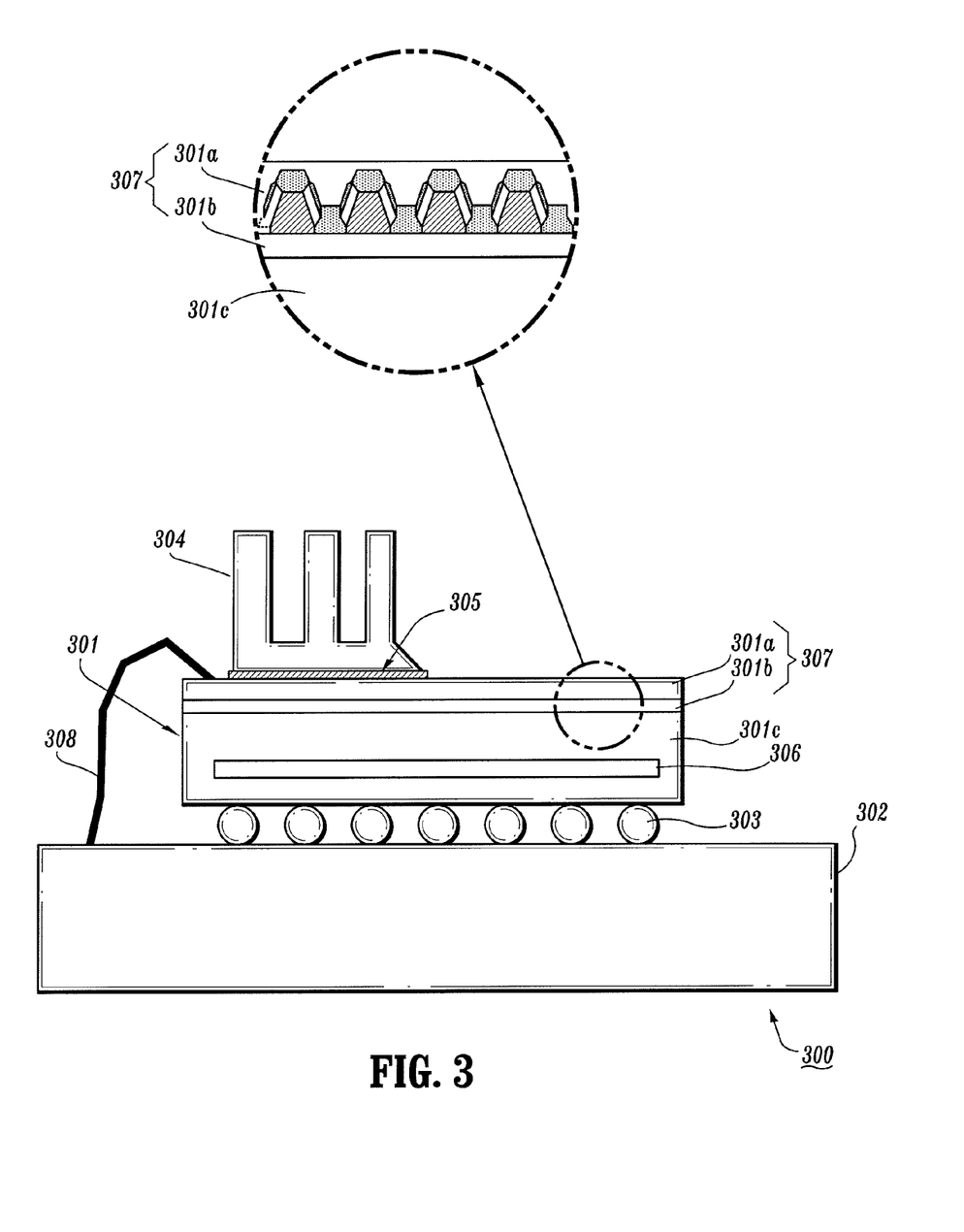
FIG. 3 schematically illustrates a chip package structure comprising a high-density semiconductor integrated thermoelectric cooling device integrally formed in the non-active surface of a chip, according to an exemplary embodiment of the invention.

FIG. 3 schematically illustrates a chip package structure comprising a high-density semiconductor integrated thermoelectric cooling device integrally formed on the non-active (back) surface of a chip, according to an exemplary embodiment of the invention. In particular, FIG. 3 schematically illustrates a package structure (300) comprising an IC chip (301) flip-chip mounted on a carrier substrate (302), wherein the active (front) surface of the chip (301) is mounted on the carrier substrate (302) via contact solder balls (e.g., C4's).

An air cooled heat sink device (304) (a portion of which is depicted in FIG. 3) is thermally coupled to the non-active (back) surface of the chip (301) to remove heat from the chip (301). Other heat removal mechanism such as microchannel liquid cooling structures can be used instead of the heat sink (304). The heat sink (304) is thermally coupled to the back surface of the chip (301) via a TIM (thermal interface material) layer (305). The TIM layer (305) may be formed of a material such as silicone-based greases, elastomeric pads, thermally conductive tapes, or thermally conductive adhesives. Furthermore, compliant TIM materials may be used (such as thermal pastes) to provide mechanical compliance for the package structure (300) as well as thermal conductive path between the chip (301) and heat sink (304).

The chip (301) comprises a device layer (306) comprising one or more integrated circuits formed in the active surface of the chip (301). The chip (301) further comprises a thin-film TE device layer (307) integrally formed on the non-active surface of the chip (301). The TE device layer (307) comprises TE element array layer (301a) formed on an oxide (insulating) layer (301b), and the TE device layer is formed on a silicon layer (301c). In one exemplary embodiment of the invention, the IC chip (301) is a SOI substrate, wherein the device layer (306) is formed in the bulk silicon layer (301c) (back surface) of the SOI substrate, wherein the TE element array (301a) is formed on the thin silicon layer (front surface) of the SOI substrate, with the buried oxide layer (301b) of the SOI substrate interposed there between. In all such embodiments, the TE device layer (307) can be formed using methods as discussed above with reference to FIGS. 2A~2K. As noted above, the TE elements in the TE device layer (307) can be formed at low temperatures, e.g., below 250° C. Therefore, the TE elements should be fabricated after the integration and metallization of device circuits (306) on the front side of the chip (301) are complete and protected.

Moreover, the package structure (300) comprises wire bonds (308) can be used as connections between TE elements in the TE device layer (307) and I/O pads on the substrate (302) to provide, e.g., power supply and ground connections for the TE element arrays of the TE device layer (307). In the exemplary embodiment of FIG. 3, the integrated TE device layer (307) can be operated to transfer heat that is generated by the IC device layer (306) to the heat sink (304) for cooling the IC chip (301).

Figure 4:
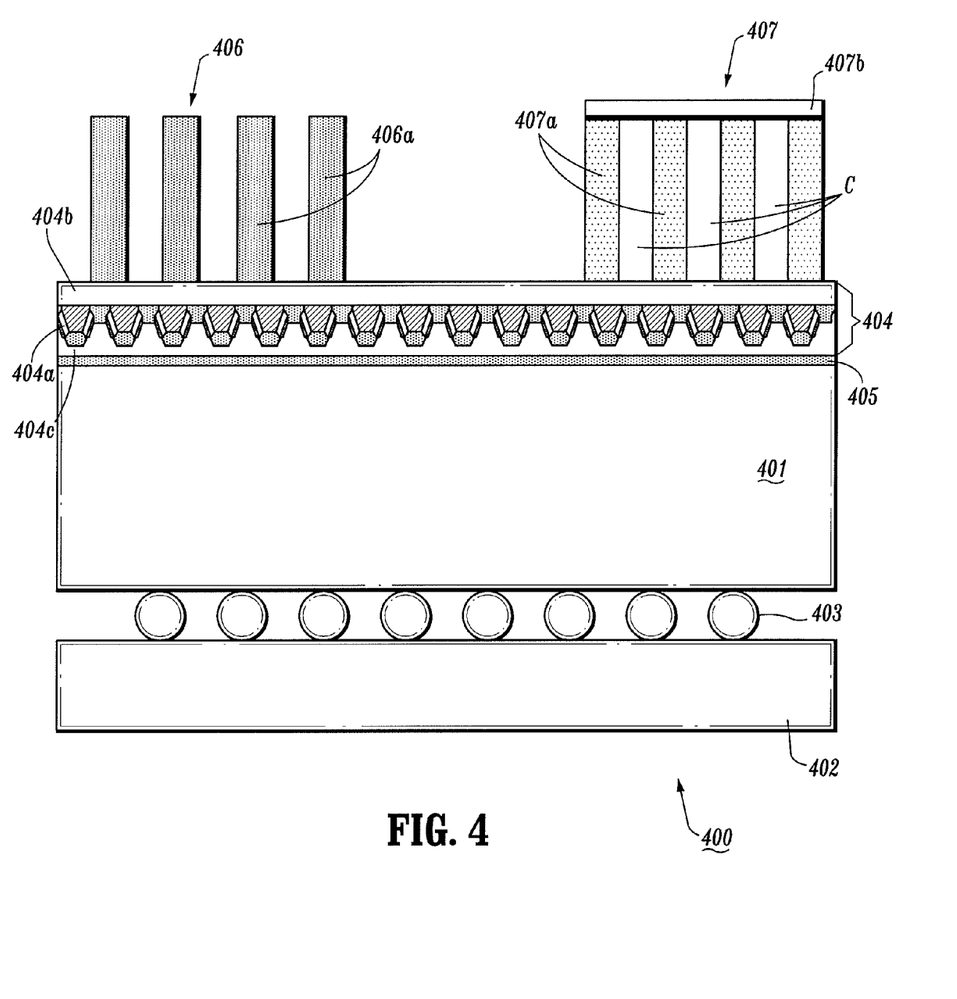
FIG. 4 schematically illustrates a chip package structure comprising a high-density semiconductor integrated thermoelectric cooling device thermally bonded to a semiconductor chip, according to an exemplary embodiment of the invention.

In other exemplary embodiments of the invention, integrated TE devices can be separately fabricated and bonded to semiconductor chips. For instance, FIG. 4 schematically illustrates a package structure (400) comprising a chip (401) flip-chip mounted on a package substrate (402) via solder connections (403). The package (400) comprises an integrated TE device (404) that is thermally coupled to the non-active (back) surface of the chip (401) via a TIM layer (405).

The integrated TE device (404) comprises an array of TE elements (404a) and insulating layers (404b) and (404c), which can be formed on an SOI substrate using methods as discussed above. The SOI substrate comprises an oxide layer (404b) with a heat removing device (406) or (407) attached to, or integrally formed on, the back surface of the SOI substrate. In one exemplary embodiment, the heat removing device (406) comprises a heat sink (406) formed of a plurality of thermal fins (406a) that are bonded to the oxide layer (404b) to provide air cooling. In another embodiment, the thermal fins (406a) may be formed by etching deep trenches in the backside (bulk silicon layer) of an SOI substrate (which is used to form the TE device (404)) down to the oxide layer (404b), filling the trenches with a thermally conductive material such as metal, CVD diamond, or CVD alumina, and then removing the silicon material between the thermal fins (406a).

In another exemplary embodiment, the cooling device (407) comprises a microchannel cooler having a plurality of thermal microfins (407a) and a cover plate (407b), which form a plurality of channels (C) through which coolant fluid flows, as is well-known in the art. The microchannel cooler device (407) may be separately formed by constructing a microchannel plate that is bonded to the TE device (404) via a rigid bond or via a TIM layer, using methods known to those of ordinary skill in the art.

In another exemplary embodiment, the thermal microfins (407a) and other cavity structures of the microchannel cooler (407) may be etched or otherwise integrally formed on the backside (bulk silicon layer) of an SOI substrate used to form the TE device (404), with a separate cover (407b) mounted on top of the integrally formed fins (407a). In other words, in such embodiment, the thermal fins (407a) are formed of silicon by etching the bulk (back) silicon layer of an SOI substrate. Moreover, in one exemplary embodiment, the cover (407b) comprises a silicon plate that is bonded to the top of the thermal fins using any suitable watertight forming seal known to those of ordinary skill in the art.

Figure 5:
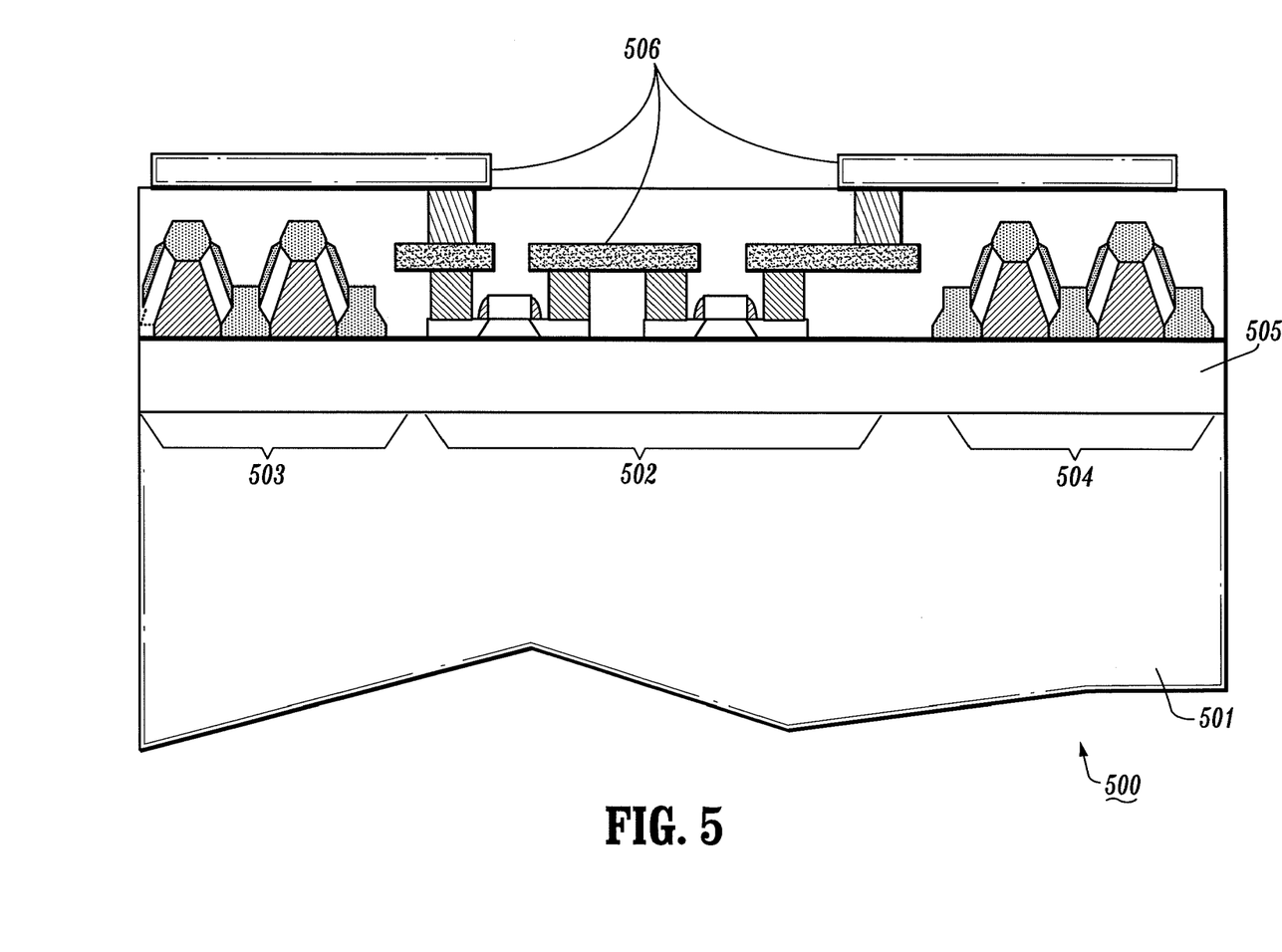
FIG. 5 schematically illustrates a device and method for embedding thermoelectric elements near regions of an integrated circuit to provide localized and precision cooling, according to an exemplary embodiment of the invention.

In other exemplary embodiments of the invention, TE elements can be embedded within integrated circuits of an IC chip in proximity to devices, elements, components, etc., of an integrated circuit, to enable precise and localized temperature control for desired regions/portions of the IC chip. For instance, TE elements can be integrally formed near circuit devices in "hot spot" regions of the chip (i.e., regions of higher than average power density). In particular, FIG. 5 schematically illustrates a cross-section of a chip (500) comprising a substrate (501), an oxide (insulating) layer (505) formed on the substrate (501), an integrated circuit formed in a region (502) of the chip surface, and arrays of TE elements formed in regions (503) and (504) of the active surface of the chip (500). The regions of TE elements (503) and (504) are formed in proximity to the integrated circuit region (502), which comprises multi-level interconnect structure (506), to provide increased heat removal and cooling capability for the integrated circuit region (502).

It is to be appreciated that integrated TE devices according to the invention can be operated to conduct heat in either direction. Thus, integrated TE device can be design to incorporate thermal sensors for precisely controlling the on-chip temperature by using the TE elements arrays for cooling or heating. For example, the methods described in U.S. Pat. No. 6,548,894, entitled "Electronic Module With Integrated Programmable Thermoelectric Cooling Assembly and Method of Fabrication", which is commonly assigned and incorporated herein by reference, can be used in conjunction with integrated TE devices according to the invention for precision heat control. Briefly, the above-incorporated patent discloses methods for integrating a thermoelectric assembly with a programmable power control circuit in the thermal dissipation assembly of an electronic module, which can be used to adjust the voltage level of the thermoelectric elements and the cooling capacity of the thermoelectric assembly. Power is provided to the thermoelectric assembly through conductive power planes in a supporting substrate on the backside of a chip.

It is to be appreciated that integrated TE devices according to exemplary embodiments of the invention provide high density integrated TE element arrays in which the number of TE elements and the number of I/Os can be significantly increased. Indeed, the reduction of the dimensions of TE elements using advanced thin-film material and technologies results in a significant improvement in heat pumping capacity of the integrated TE devices as compared to conventional modules. For instance, as noted above, an ultra high density TE device according to an embodiment of the invention, which includes 20 million cells per centimeter square and 50 I/Os, could yield a heat removing capacity of 1200 W/cm$^2$, compared to about 10 W/cm$^2$ with convention low-density TE devices.

Moreover, integrated TE devices according to the invention are small, light weight, maintenance free, environmentally friendly, acoustically silent (no moving parts) and electrically quiet. Moreover, integrated TE devices according to the invention can provide both active heating and cooling with precise temperature control (within 0.1° C.), and operate in a wide temperature range from sub-ambient cooling to low temperature (−80° C.) cooling.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. An integrated circuit chip, comprising:
   an integrated circuit layer formed on an active surface of the integrated circuit chip; and
   a thermoelectric device, comprising:
      a substrate comprising a pattern of step structures formed in an insulating layer, the step structures being formed of an insulating material;
      a plurality of thermoelectric (TE) elements formed on sidewalls of the step structures such that each step structure comprises an n-type TE element formed on a first sidewall and a p-type TE element formed on a second sidewall opposite the first sidewall; and
      metallic interconnects formed between adjacent step structures and on top of each step structure to connect adjacent TE elements,
      wherein the step structures and the TE elements formed on the sidewalls of the step structures are completely embedded within the integrated circuit layer.

2. The device of claim 1, wherein the step structures have a height of about 0.1 micron to about 1 micron.

3. The device of claim 1, wherein the TE elements are formed of an extrinsic alloy semiconductor material.

4. The device of claim 1, wherein the TE elements are formed of SiGe.

5. The device of claim 1, wherein the sidewalls of the step structures are tapered.

6. The device of claim 1, wherein the insulating layer encapsulates the TE elements and the metallic interconnects.

7. The device of claim 1, wherein the substrate is a SOI (silicon on insulator) substrate comprising an oxide layer and a silicon layer formed on the oxide layer.

8. An integrated circuit chip, comprising:
   a device layer comprising an integrated circuit; and
   a thermoelectric device layer comprising a thermoelectric device, wherein the thermoelectric device comprises:
      a substrate comprising a pattern of step structures formed in a first insulating layer, the step structures being formed of an insulating material, wherein a width of the step structures is different from a width of spaces between the step structures;
      a plurality of thermoelectric (TE) elements formed on sidewalls of the step structures such that each step structure comprises an n-type TE element formed on a first sidewall and a p-type TE element formed on a second sidewall opposite the first sidewall; and
      metallic interconnects formed between adjacent step structures and on top of each step structure to connect adjacent TE elements, wherein the metallic interconnects connect the TE elements at top and bottom portions of the step structures,
      wherein the device layer is completely enclosed within a silicon layer of the integrated circuit chip and does not contact the thermoelectric device layer, the thermoelectric device layer is formed on a second insulating layer of the integrated circuit chip, and the second insulating layer separates the silicon layer and the thermoelectric device layer and does not contact the device layer.

9. The integrated circuit chip of claim 8, wherein the interconnects formed at the top portions contact the step structures and the interconnects formed at the bottom portions directly contact the substrate and the pattern of step structures.

10. A semiconductor package, comprising:
    a semiconductor chip; and
    a thermoelectric device, comprising:
       a substrate comprising a pattern of step structures formed in an insulating layer, the step structures being formed of an insulating material;
       a plurality of thermoelectric (TE) elements formed on sidewalls of the step structures such that each step structure comprises an n-type TE element formed on a first sidewall and a p-type TE element formed on a second sidewall opposite the first sidewall, wherein the n-type TE element is not in direct contact with the p-type TE element; and
       metallic interconnects formed contacting adjacent step structures and on top of each step structure to connect adjacent TE elements, wherein a top surface of each metallic interconnect is exposed to the insulating layer,
       wherein the thermoelectric device is separate from the semiconductor chip and is thermally bonded directly to a non-active surface of the semiconductor chip via a thermal interface material layer.

11. The semiconductor package of claim 10, wherein the metallic interconnects connect the TE elements at top and bottom portions of the step structures.

12. The semiconductor package of claim 11, wherein the interconnects formed at the top portions contact the step structures and the interconnects formed at the bottom portions directly contact the substrate and the pattern of step structures.

13. The device of claim 1, wherein the plurality of TE elements are embedded only in a regions of the integrated circuit layer having a high power density.

14. The integrated circuit chip of claim 1, further comprising:
    a plurality of nitride spacers formed on the plurality of TE elements, wherein the metallic interconnects are formed of a salicide.

15. The integrated circuit chip of claim 14, wherein the plurality of TE elements are formed of a TE material, and the metallic interconnects are formed by converting a portion of the TE material corresponding to the metallic interconnects to the salicide using a self-aligned silicidation process.

16. The integrated circuit chip of claim 1, wherein the plurality of TE elements are formed directly on the step structures.

17. The integrated circuit chip of claim 8, further comprising:
a plurality of nitride spacers formed on the plurality of TE elements, wherein the metallic interconnects are formed of a salicide.

18. The integrated circuit chip of claim 17, wherein the plurality of TE elements are formed of a TE material, and the metallic interconnects are formed by converting a portion of the TE material corresponding to the metallic interconnects to the salicide using a self-aligned silicidation process.

19. The semiconductor package of claim 10, further comprising:
a plurality of nitride spacers formed on the plurality of TE elements, wherein the metallic interconnects are formed of a salicide.

20. The integrated circuit chip of claim 19, wherein the plurality of TE elements are formed of a TE material, and the metallic interconnects are formed by converting a portion of the TE material corresponding to the metallic interconnects to the salicide using a self-aligned silicidation process.

* * * * *